United States Patent [19]

Gurvitch et al.

[11] Patent Number: 4,837,609

[45] Date of Patent: Jun. 6, 1989

[54] SEMICONDUCTOR DEVICES HAVING SUPERCONDUCTING INTERCONNECTS

[75] Inventors: Michael Gurvitch, Murray Hill; Roland A. Levy, Berkeley Heights, both of N.J.

[73] Assignee: American Telephone and Telegraph Company, AT&T Bell Laboratories, Murray Hill, N.J.

[21] Appl. No.: 94,573

[22] Filed: Sep. 9, 1987

[51] Int. Cl.[4] ............................................. H01L 29/48
[52] U.S. Cl. ..................................... 357/71; 505/923; 505/922; 505/919; 357/67; 357/5
[58] Field of Search ................ 357/71 R, 71 S, 67 R, 357/67 S, 5; 505/923, 922, 920, 919

[56] References Cited

U.S. PATENT DOCUMENTS

| | | | |
|---|---|---|---|
| 4,141,022 | 2/1979 | Sigg | 357/71 S |
| 4,507,851 | 4/1985 | Joyner | 357/67 S |
| 4,660,061 | 4/1987 | Sweeny | 357/5 |
| 4,724,475 | 2/1988 | Matsuda | 357/71 |

Primary Examiner—Martin H. Edlow
Attorney, Agent, or Firm—Bernard Tiegerman

[57] ABSTRACT

A semiconductor device which includes either a single semiconductor chip bearing an integrated circuit (IC) or two or more electrically interconnected semiconductor chips, is disclosed. This device includes interconnects between device components (on the same chip and/or on different chips), at least one of which includes a region of superconducting material, e.g., a region of copper oxide superconductor having a $T_c$ greater than about 77K. Significantly, to avoid undesirable interactions, at high processing temperatures, between the superconducting material and underlying, silicon-containing material (which, among other things, results in the superconducting material reverting to its non-superconducting state), the interconnect also includes a combination of material regions which prevents such interactions.

9 Claims, 2 Drawing Sheets

SEMICONDUCTOR DEVICES HAVING SUPERCONDUCTING INTERCONNECTS

BACKGROUND OF THE INVENTION

1. Field of the Invention

The invention pertains to semiconductor devices which include superconducting interconnects.

2. Art Background

A superconducting material is one which exhibits zero resistance to the flow of DC electrical current. Such a material is characterized by a temperature, called the critical temperature ($T_c$), above which the material ceases to be superconducting.

Prior to 1986, the known superconducting materials included elemental metals, such as Hg, intermetallic compounds, such as $Nb_3Ge$, as well as a few (non-cuprate) metal oxides, such as $BaPb_{1-x}Bi_xO_3$, where $0.05 \leq X \leq 0.3$. Significantly, all these materials have $T_c$s which are less than or equal to about 23.3 Kelvins (K.). As a consequence, it is necessary to use relatively expensive liquid helium to cool these materials below their respective $T_c$s to achieve superconductivity, which makes the use of these superconductors relatively expensive.

In 1986, J. G. Bednorz and K. A. Muller published their now seminal discovery that compositions in the La-Ba-Cu-O system are superconducting and have $T_c$s as high as about 30 K. (See J. G. Bednorz and K. A. Muller, Zeitschr. f. Physik B-Condensed Matter, Vol. 64, 189 (1986).) This discovery stimulated scientists all over the world to look for compositions having even higher $T_c$s resulting, among other things, in the discovery by C. W. Chu and colleagues that mixed phase compositions in the Y-Ba-Cu-O system have $T_c$s as high as about 93 K. (See M. K. Wu et al, Physical Review Letters, Vol. 58, 908 (1987); and P. H. Hor et al, Physical Review Letters, Vol. 58, 991 (1987).) This latter discovery generated considerable excitement because the latter compositions are readily cooled below their $T_c$s with relatively inexpensive liquid nitrogen (which has a boiling point of 77 K.), making their use as superconductors relatively inexpensive and thus potentially commercially attractive. This discovery, in turn, was followed by the idenification by R. J. Cava and colleagues of $YBa_2Cu_3O_7$ as being the particular phase in the Y-Ba-Cu-O system responsible for the high temperature superconductivity. (See R. J. Cava et al, Physical Review Letters, Vol. 58, 1676 (1987).)

To date, the research efforts of Bednorz and Muller, and those they inspired, has resulted in the identification of two classes of copper oxide superconductors. The first class has nominal composition $La_{2-x}M_xCu\ O_{4-\epsilon}$, where M denotes one or more divalent metals, such as Ba, Sr or Ca, $0 \leq X \leq 0.3$ and $0 \leq \epsilon \leq 0.1$. (See R. J. Cava et al, Physical Review Letters, Vol. 58, 408 (1987); and K. Kishio et al, Chemistry Letters, 429 (1987).) The members of this first class have been found to have $T_c$s ranging from about 30 K. to about 40 K.

The second class of copper oxide superconductors has nominal composition $Ba_{2-y}(M_{1-x}^{(1)}M_x^{(2)})_{1+y}Cu_3O_{9-\delta}$, where $0 \leq X \leq 1$, $0 \leq y \leq 1$, $1 < \delta < 3$ and each of $M^{(1)}$ and $M^{(2)}$ denotes Y, Eu, Nd, Sm, Gd, Dy, Ho, Er, Tm, Yb, Lu, La, Sc, Sr or combinations of these elements. (See D. W. Murphy et al, Physical Review Letters, Vol. 58, 1888 (1987); P. H. Hor et al, Physical Review Letters, Vol. 58, 1891 (1987); and presentation given by J. M. Tarascon et al at Materials Research Society Meeting, Anaheim, California, April 1987). Significantly, many of the members of this second class have $T_c$s greater than about 77 K. (the boiling point of liquid nitrogen.).

Just recently, there have been reports that partial or complete substitution of fluorine for copper in the second class of copper oxide superconductors also yields superconductors with $T_c$s greater than about 77 K. (See S. R. Ovshinsky et al, Physical Review Letters, Vol. 58, 2579 (1987).)

The discovery of superconductors having relatively high $T_c$s, e.g., $T_c$s greater than about 77 K., has led to a wide variety of proposed applications. One such proposal is to use (liquid nitrogen-cooled) superconductors as interconnects (electrical conducotrs extending, and used for transmitting signals, between device components) on and between semiconductor chips. (See, e.g., the newspaper article by Andrew Pollack entitiled, "Standford Reports Advance In Race for Supercomputer," The New York Times, page 7, Mar. 14, 1987; and the newspaper article by James Gleick entitled, "New Superconductors Offer Chance to Do the Impossible," The New York Times, page 1, Apr. 9, 1987.) One of the advantages underlying this proposal is the fact that such use would reduce, or even entirely eliminate, the RC delay times associated with present-day interconnects, to achieve faster signal transmission and thus faster devices. In addition, the use of superconducting interconnects would lead to reduced ohmic (resistive) heating, permitting reductions in distances between device components, which would also lead to faster devices. Significantly, implicit in this proposal, is the assumption that there is no incompatibility between the relatively high $T_c$ superconductors and semiconductors materials, and that no substantial impediments exist to implementation and to the achievement of the underlying advantages.

SUMMARY OF THE INVENTION

The invention involves the finding that, in certain circumstances, the new, relatively high $T_c$ superconductors are incompatible with semiconductor materials, such as Si, as well as with other silicon-containing materials commonly found in semiconductor devices, including $SiO_2$ and metal silicides. That is, physical contact between any of the new superconductors and, for example, Si, at relatively high temperatures, e.g., temperatures equal to or greater than about 800 degrees Centigrade (C.), results in the superconductors being poisoned by (i.e., undergoing an undersirable interaction with) the Si and, as a consequence, reverting to their non-superconducting states. (It is believed that this poisoning involves diffusion of Si into the superconductors.) Because the currently available techniques for forming thin films of the new superconductors on semiconductor substrates require the use of relatively high temperatures, physical contact leads to an unavoidable loss of superconductivity.

The invention further involves the finding that interposing a particular combination of material regions between the new superconductors and, for example, Si, prevents superconductor poisoning while also achieving a relatively low electrical contact resistivity to Si. This combination includes a region containing Ag and/or Au, positioned between the superconductor and the Si, and preferably in contact with the superconductor. Significantly, Ag and Au are not incompatible (in the above-described sense) with the new superconductors. However, Ag and Au diffuse into Si, during high temperature processing, to produce recombination/generation centers leading to undesirable leakage currents in semiconductor devices.

Wherever the region containing Ag and/or Au would otherwise contact silicon device components, e.g., silicon sources and drains, the above combination of material regions also includes a barrier to Ag and Au diffusion, positioned between the region containing Ag and/or Au and the silicon. Such barrier includes, for example, a region of refractory metal, such as W, Mo or Ta. Significantly, refractory metals, such as W, also poison the new superconductors. However, the region containing Ag and/or Au not only prevents poisoning of the new superconductors by Si, but also prevents poisoning by the refractory metals. In addition, the region containing Ag and/or Au prevents oxidation of, for example, underlying W in the diffusion barrier, during high temperature processing, otherwise leading to the formation of volatile tungsten oxides and, as a consequence, the disintegration of the diffusion barrier.

While not essential, and wherever the diffusion barrier would otherwise contact silicon device components, e.g., silicon sources and drains, the above combination preferably further includes a region of slightly silicon-rich metal silicide, such as tungsten silicide, positioned between the diffusion barrier and the Si. This additional region reduces the silicon concentration gradient at the interface between the Si and the material combination, reducing the possibility of silicon diffusing into the combination. Such diffusion is undesirable because (in addition to poisoning the superconductor) it leads to the formation of Ag/Si and/or Au/Si alloys having reduced (compared to Ag and Au) melting temperatures and, as a consequence, leads to a reduction in the mechanical integrity of the Ag and/or Au during high temperature processing. The presence of the metal silicide region also reduces the possibility of device components, such as sources and drains, being eroded as a result of silicon (from the components) combining with the refractory metals to form metal silicides during high temperature processing. In addition, this region improves adhesion of the inventive combination to the interlevel dielectrics employed in semiconductor devices, and reduces contact resistivity to silicon.

BRIEF DESCRIPTION OF THE DRAWINGS

The invention is described with reference to the accompanying drawings, wherein.

DETAILED DESCRIPTION

The invention is directed to a semiconductor device which includes either a single semiconductor chip containing an integrated circuit (IC) or two or more electrically interconnected IC-containing semiconductor chips. The inventive device is distinguished from previous such devices in that it includes one or more relatively high $T_c$ superconducting interconnects extending between device components (on the same chip and/or on different chips). In addition, and as discussed above, wherever the superconducting interconnects would otherwise contact silicon-containing device materials, such as silicon, silicon dioxide and metal silicides, which poison the superconductors, the interconnects include an intervening, particular combination of material regions which prevents such poisoning. As a consequence, the expected advantages of superconducting interconnects are realized, i.e., the interconnects exhibit reduced RC delay times and reduced resistive heating, leading to reduced signal transmission delays and smaller distances between device components which, in turn, lead to faster devices.

Figure 1:
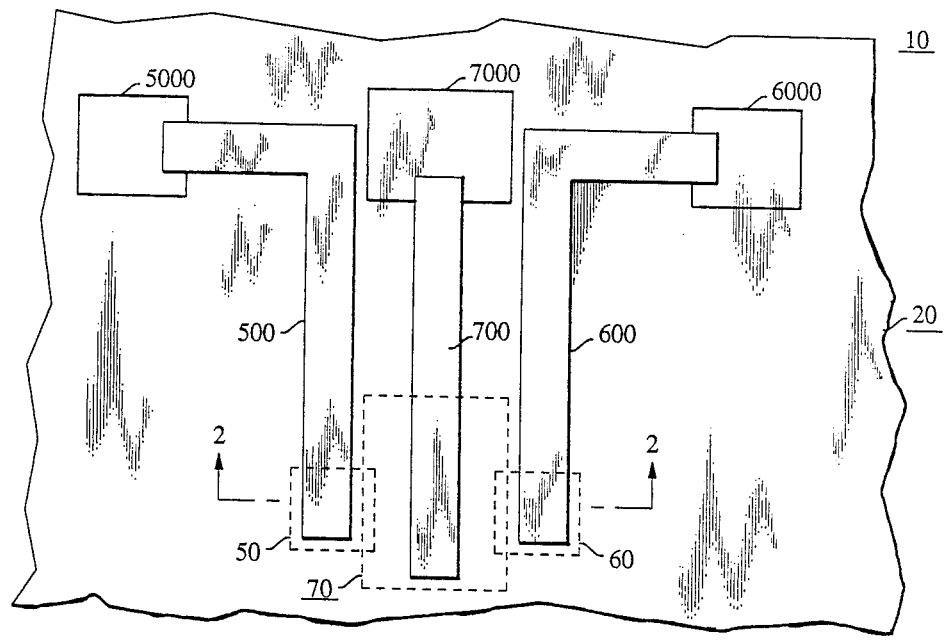
FIG. 1 is a top view of a first embodiment of the invention.
Figure 2:
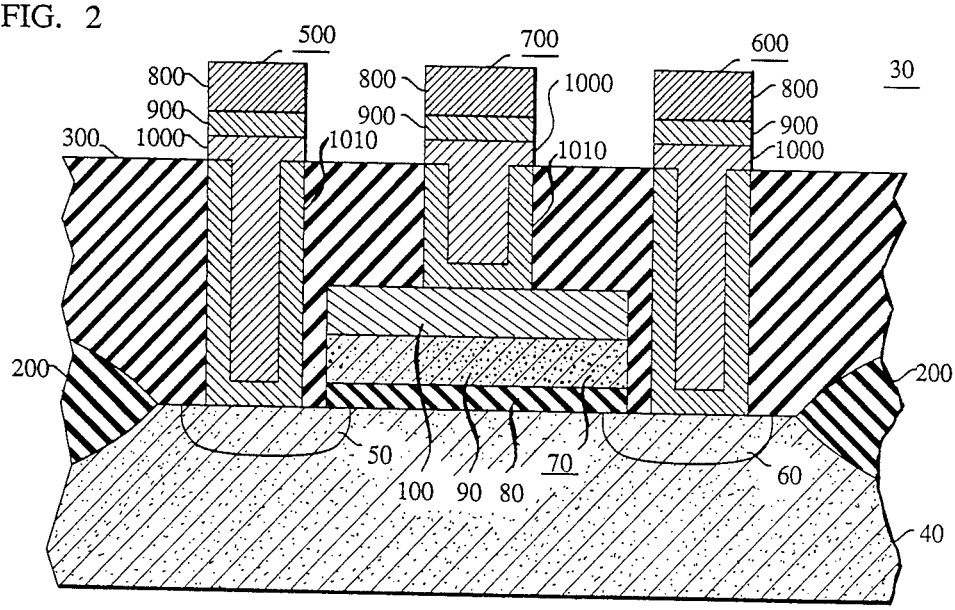
FIG. 2 is a cross-sectional view of the first embodiment, taken along the line 2—2 in FIG. 1.

With reference to FIGS. 1 and 2, a first embodiment of the inventive semiconductor device 10 includes a single IC-containing semiconductor chip 20 (only a portion of which is shown in FIG. 1). The chip includes a substrate 40 (see FIG. 2) containing semiconductor material, i.e., silicon, in and on which the chip IC is formed. The IC formed in and on the silicon includes (by definition) two or more electrically interconnected discrete devices, such as MOSFETs (metal-oxide-semiconductor field effect transistors) 30. (For the sake of simplicity, FIG. 1 depicts but a single MOSFET of the IC).

As shown in FIG. 2, each MOSFET 30 of the chip IC includes a relatively thin region 80 of $SiO_2$, formed on the surface of the silicon substrate 40, which serves as the gate oxide (GOX). The MOSFET also includes a conducting gate electrode 70, formed on the surface of the GOX 80, which includes, for example, a single region 90 of doped polycrystalline silicon (polysilicon). Alternatively, the gate electrode 70 includes a combination of material regions, i.e., a region 100 of metal silicide, such as cobalt silicide, molybdenum silicide, tungsten silicide, titanium silicide or tantalum silicide, overlying a region 90 of doped polysilicon. Two relatively heavily doped portions of the silicon substrate 40, on opposite sides of the gate electrode 70, constitute the source 50 and drain 60 of the MOSFET. A relatively thick (compared to the GOX) field oxide (FOX) 200, of $SiO_2$, serves to separate and electrically insulate the MOSFET 30 from other IC components.

The IC on the chip 20 also includes electrically conductive interconnects between the discrete devices of the IC. In particular, as shown in FIG. 1, the chip IC includes interconnects 500, 600 and 700 electrically connecting the source 50, the drain 60 and the gate electrode 70 of the MOSFET 30 to other IC components which, for purposes of simplicity, are depicted to be a source contact pad 5000, a drain contact pad 6000 and a gate contact pad 7000.

At least one, and preferably each, of the interconnects 500, 600 and 700 includes a region 800 (see FIG. 2) of relatively high $T_c$ superconducting material, e.g., a region of material chosen from one of the two classes of relatively high $T_c$ superconducting copper oxides. The thickness of the superconducting region 800 ranges from about 0.1 micrometers ($\mu$m) to about 3 $\mu$m. Thickness less than about 0.1 $\mu$m are undesirable because such thin regions have undesirably low current-carrying capacities and are highly susceptible to surface contamination by, for example, W in the underlying diffusion barrier (discussed below), leading to non-superconducting surface portions. Thicknesses greater than about 3 $\mu$m are undesirable because such thick regions are difficult to pattern, and are subject to cracking and peeling.

As discussed below, relatively high temperatures are involved in the formation of the superconducting regions 800. Consequently, to avoid poisoning the superconductors, physical contact between the regions 800 and the silicon of the source 50 and drain 60, metal silicide and/or polysilicon of the gate electrode 70, and the silicon dioxide of the interlevel dielectric 300 (discussed below) is precluded. (It is believed that the poisoning involves diffusion of silicon into the superconducting regions 800.) Thus, in accordance with the invention, and as discussed above, each interconnect includes a region 900 containing, and preferably consisting essentially of, Ag and/or Au, which has been found not to poison the relatively high $T_c$ superconductors even at relatively high processing temperatures, interposed between each superconducting region 800 and the poisonous materials. The thickness of each region 900 ranges from about 0.01 $\mu$m to about 2 $\mu$m. Thickness less than about 0.01 $\mu$m are undesirable because such thin regions are ineffective in preventing poisoning of the superconducting region 800 by, for example, W in the underlying diffusion barrier (discussed below). Thicknesses greater than about 2 $\mu$m are undesirable because such thick regions are difficult to pattern, and are subject to cracking and peeling.

As noted earlier, while the Ag and/or Au in the region 900 is not poisonous to the superconductor, this Ag and/or Au tends to diffuse into the silicon substrate 40 during high temperature processing, leading to undersirable leakage currents in the semiconductor device. To prevent such diffusion, at least the silicon contact portion of each interconnect, i.e., the portion which contacts a device component in the silicon substrate 40, such as the source 50 or the drain 60, also includes an intervening material region 1000 which acts as a barrier to such diffusion, i.e., acts to reduce, or entirely preclude, such diffusion. Useful barrier materials include refractory metals such as W, Mo and Ta. The thickness of the barrier region 1000 ranges from about 0.04 $\mu$m to about 2 $\mu$m. Thickness less than about 0.04 $\mu$m are undesirable because such thin regions are often discontinuous, and thus ineffective as diffusion barriers. Thicknesses greater than about 2 $\mu$m are undesirable because such thick regions are difficult to pattern, and are subject to cracking and peeling.

Significantly, in the absence of the Ag and/or Au-containing region 900, the refractory metals, such as W, useful in the barrier region 1000, also poison the relatively high $T_c$ superconductors. Advantageously, the Ag and/or Au-containing region 900 plays a synergistic role, i.e., prevents poisoning by, for example, Si, while also preventing poisioning by, for example, W. In addition, the region 900 prevents oxidation of, for example, W, during high temperature processing, which otherwise leads to the formation of volatile tungsten oxides and, consequently, the disintegration of the diffusion barrier.

While not essential, at least the silicon contact portion of each interconnect preferably further includes a region 1010 of slightly silicon-rich metal silicide, such as tungsten silicide, molybdenum silicide or tantalum silicide. (For purposes of the invention, a metal silicide is slightly silicon-rich provided the silicide includes more than the stoichiometric amount of silicon, and the amount of excess silicon is no more than about 25 percent of the stoichiometric amount.) The silicon-rich metal silicide serves, among other things, to reduce the silicon concentration gradient at the interface between the silicon substrate 40 and the diffusion barrier 1000, reducing the possibility of silicon diffusing into the overlying material regions. Such diffusion is undersirable because (in addition to poisoning the superconductor) it leads to the formation of Ag/Si and/or Au/Si alloys having reduced (compared to Ag to Au) melting temperatures and, as a consequence, leads to a reduction in the mechanical integrity of the Ag and/or Au during high temperature processing. The presence of the metal silicide region also reduces the possibility that the source 50 and drain 60 will be eroded during high temperature processing as a result of source/drain silicon combining with the refractory metal or metals in the barrier region 1000 to form metal silicides. In addition, the presence of the metal silicide region 1010 reduces resistivity to silicon, e.g., reduces contact resistivity to the source 50 and drain 60, while increasing the adhesion of the interconnect to the interlevel dielectric 300 (discussed below). The thickness of this metal silicide region ranges from about 0.04 $\mu$m to about 2 $\mu$m. Thicknesses less than about 0.04 $\mu$m are undesirable because such thin regions are often discontinuous, and are ineffective in reducing the silicon concentration gradient at the silicide/silicon interface. Thicknesses greater than about 2 $\mu$m are undesirable because such thick regions are difficult to pattern, and are subject to cracking and peeling.

Not only does the inventive combination of material regions prevent superconductor poisoning but, as noted, this combination, even without the metal silicide region 1010, achieves a relatively low contact resistivity to silicon sources and drains, i.e., readily achieves a contact resistivity equal to or less than about $10^{-6}$ ohm-cm$^2$. Particularly low contact resistivites, i.e., contact resistivities equal to or less than about $10^{-7}$ ohm-cm$^2$, readily achieved by including the metal silicide region 1010 in the inventive combination.

Preferably, the contact pads 5000, 6000 and 7000 (see FIG. 1) are an integral part of the interconnects 500, 600, and 700. Consequently, each contact pad also includes a superconducting region 800, as well as underlying regions 900, 1000 and 1010 (see FIG. 2). Because gold wires are ultimately bonded to the contact pads, each contact pad, and its corresponding interconnect, also includes an overlying region of gold (not shown in FIG. 2) to enhance ease of bonding. Alternatively, the contact pads are not integral with the interconnects, and each includes, for example, a region of gold. As a result, the interconnects need not include an overlying region of gold.

The techniques used to fabricate the first embodiment of the inventive device 10 are, on the whole, conventional. That is, a relatively thick layer of SiO$_2$, typically having a thickness of about 0.3 $\mu$m, which ultimately serves as the FOX 200 (see FIG. 2), is initially grown on the substrate 40 using, for example, conventional thermal oxidation techniques. Windows are etched in this SiO$_2$ layer, using conventional etchants, to expose surface regions of the substrate 40, called gate-and-source-and-drain (GASAD) regions, where MOSFETs are to be formed. A relatively thin (compared to the FOX) layer of SiO$_2$, typically having a thickness of about 0.03 $\mu$m, which ultimately serves as the GOX 80, is grown on the surface of each GASAD region, using conventional techniques. The gate electrode 70 of each MOSFET, which typically has a thickness of about 0.6 $\mu$m, is formed on this relatively thin layer SiO$_2$, using conventional techniques, and is then used as an etch mask while etching away the portion of the thin $SiO_2$ layer not covered by the gate electrode, thus forming the GOX 80 of each MOSFET. While using the gate electrodes 70 as implantation masks, dopants are implanted into the GASAD regions on opposite sides of each gate electrode 70. If the chip 20 includes, for example, p-channel MOSFETs, then the substrate 40 includes a bulk region of n-type conductivity and the implanted dopants are p-type dopants. If the chip 20 includes n-channel MOSFETs, then the subtrate 40 includes a bulk region of p-type conductivity and the implanted dopants are n-type dopants. If the chip 20 includes both n-channel and p-channel MOSFETs, then the substrate 40 includes both p-type and n-type bulk regions, and both n-type and p-type dopants are employed.

An interlevel dielectric 300 (see FIG. 2), which serves to electrically insulate the gate electrode metallization from the source and drain metallizations, and typically having a thickness of about 1.0 $\mu$m, is now deposited onto the FOX 200, onto the gate electrodes 70, as well as onto the implanted portions of the GASAD regions. The interlevel dielectric 300 includes, for example, $SiO_2$—$P_2O_5$ or $SiO_2$—$P_2O_5$—$B_2O_3$, electrically insulating materials which are readily deposited using conventional chemical vapor deposition (CVD) techniques. The upper surface of the deposited interlevel dielectric 300 is typically nonplanar (which is generally undesirable during subsequent processing). To induce the interlevel dielectric to flow, and thus achieve surface planarity, as well as to diffuse the implanted dopants into the substrate 40 to form the sources 50 and drains 60, the substrate is heated to temperatures of, for example, about 950 degrees C. for a time period of about 1 hour.

After the formation of the sources and drains, the interlevel dielectric 300 is patterned, using conventional techniques, to open via holes to the sources, drains and gate electrodes. The inventive interconnects, which necessarily extend into the via holes to contact the sources, drains and gate electrodes, are then formed. That is, if the inventive interconnects include the metal silicide regions 1010 (see FIG. 2), then the interconnects are formed by initially depositing, e.g., rf-sputtering or CVD-depositing, a layer of metal silicide (having the thickness discussed above) onto the upper surface of the interlevel dielectric, as well as into the bottom, and onto the sidewalls, of each of the via holes. If the diffusion barrier regions 1000 of the interconnects include a refractory metal such as W, Mo or Ta, then this refractory metal is similarly deposited, e.g., rf-sputtered or CVD-deposited, onto the metal silicide covering the upper surface of the interlevel dielectric 300 as well as into the via holes, the thickness of the deposited metal (dicussed above) typically being sufficient to fill up the via holes. A layer of Ag and/or Au (having the thickness discussed above) is now deposited, using similar techniques, onto the refractory metal.

The superconducting portions of the inventive interconnects are formed using, for example, a two-step, now-conventional procedure. In the first step, a layer of material, having the nominal composition of the desired superconductor, e.g., a composition selected from one of the two new classes of copper oxide superconductors, is deposited onto the layer of Ag and/or Au. This is achieved, for example, by DC magnetron sputtering the desired material onto the Ag and/or Au, in an argon-oxygen atmosphere, from a single, composite target (having the desired composition). (Regarding this sputtering technique see, e.g., M.-W. Hong et al, Applied Physics Letters, Vol. 51, 694 (1987).) Alternatively, deposition is achieved via e-beam evaporation from several targets, with the composition of each target being that of, for example, one of the constituent oxides of one of the new superconducting copper oxides. (Regarding this evaporation technique see, e.g., R. B. Laibowitz et al, Physical Review B, Vol 35, 8821 (1987).) Regardless of which deposition technique is employed, the resulting, deposited material is typically amorphous in nature and, as a result, not superconducting. Thus, in the second step of the two-step procedure, the deposited material is annealed to convert the amorphous material to a crystalline structure which exhibits the desired superconductivity. The annealing typically takes place in an atompshere of pure $O_2$. In addition, the annealing temperature ranges from about 800 degrees Centigrade (C.) to about 950 degrees C., and the annealing time ranges from a few seconds to several hours. Annealing temperatures less than about 800 degrees C. are undesirable because they do not lead to the formation of a superconducting phase. Annealing temperatures greater than about 950 degrees C. are undesirable and counterproductive because they often lead to undesirable melting of the superconducting material which, after cooling and resolidification, leads to the formation of non-superconducting phases. In addition, such relatively high annealing temperatures lead to melting of Ag and Au, and to increased diffusion of Si. (Regarding this annealing procedure see M.-W. Hong, supra.) But for the presence of the layer of Ag and/or Au interposed between the layer of superconducting material and the underlying and/or adjacent silicon-containing materials, the superconducting material would be poisoned by the silicon-containing materials during this annealing step.

If the contact pads are integral with the interconnects, then a layer of gold is deposited onto the layer of superconducting material, either prior or subsequent to the annealing procedure (to permit ready bonding of gold wires to the contact pads).

The inventive interconnects are completed by patterning the deposited material layers. This is achieved, for example, by forming an etch mask, e.g., a patterned layer of photoresist, on the upper surface of the topmost, deposited layer, covering the portions of the deposited layers to be retained. Then, the deposited layers are etched through the etch mask using conventional techniques, such as ion milling. (Regarding the ion milling procedure see R. H. Koch et al, Applied Physics Letters, Vol. 51, 200 (1987).)

After the formation of the interconnects, a protective layer of, for example, silicon nitride (having a thickness of about 1.5 $\mu$m) is plasmadeposited onto the upper surface of the interlevel dielectric 300, as well as onto the upper surfaces and exposed sides of the interconnects. This is readily achieved, using conventional techniques, at deposition temperatures which are sufficiently low, e.g., less than 350 degrees C., so as to preclude poisoning of the superconducting interconnects by the silicon nitride. The first embodiment of the inventive device is then completed using conventional procedures.

Figure 3:
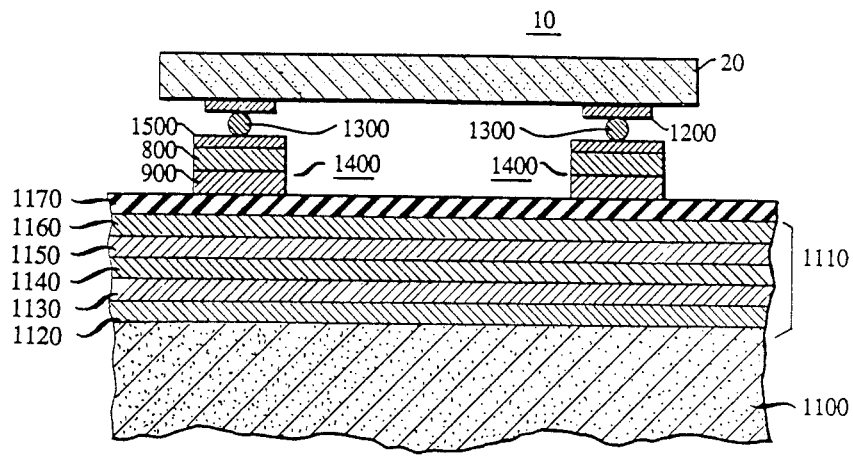
FIG. 3 is a cross-sectional view of a second embodiment of the invention.

With reference to FIG. 3, a second embodiment of the inventive device 10 includes two or more electrically interconnected chips 20 (with each chip bearing an IC) and has a configuration generally similar to that of previous such devices. That is, the chips 20 are mechanically supported by, and positioned face-down relative to, a silicon carrier substrate 1100. Electrical communication between the chips is achieved through interconnects 1400 overlying the surface of, and mechanically supported by, the carrier substrate, with the contact pads 1200 of each chip electrically contacting the interconnects through solder balls 1300. (Regarding devices having this general configuration see, e.g., C. J. Barlett et al, Proceedings of the 37th Electronic Components Conference, p. 518, May 11-13, 1987.) To avoid undesirable impedance increases and/or mismatches due to electrical and/or magnetic interactions between the interconnects and/or between the interconnects and other conductors overlying the surface of the carrier substrate 1100, the second embodiment also including a ground plane (one or more layers of electrically conductive material) 1110 on the surface of the carrier substrate, beneath the interconnects. A layer 1170 of electrically insulating material, e.g., a layer of $SiO_2$ (having a thickness of, for example, about 1.0 $\mu$m), is provided on the surface of the ground plane, immediately beneath, and in physical contact with, the interconnects 1400, to prevent the interconnects from being short-circuited (to ground).

Significantly, this second embodiment of the device 10 differs from previous such devices in that both the ground plane 1110 and one or more of the interconnects 1400 include superconducting material. That is, as shown in FIG. 3, the ground plane 1110 includes a layer 1150 of superconducting material. To prevent poisoning by the underlying silicon carrier substrate 1100 and the overlying layer 1170 of, for example, $SiO_2$, the superconducting layer 1150 is sandwiched between layers 1140 and 1160 containing, and preferably consisting essentially of, Ag and/or Au. The ground plane preferably also includes a layer 1130 of, for example, W, Mo or Ta, as well as a layer 1120 of slightly silicon-rich metal silicide, to reduce, or prevent, undesirable (for the reasons discussed above) diffusion of Si into the ground plane during high temperature processing. In addition, at least one of the interconnects 1400 includes a region 800 of superconducting material. To prevent poisoning by the silicon dioxide layer 1170, the interconnect also includes a region 900 containing, and preferably consisting essentially of, Ag and/or Au between the superconducting region 800 and the layer 1170. Moreover, the interconnect includes a region 1500 of solder-wettable material, e.g., a region of Au, which overlies the superconducting region 800. (The thicknesses of the superconducting layers and regions, and of the layers and regions of Ag and/or Au, W, Mo, Ta and metal silicide, are the same as those discussed above.)

Figure 4:
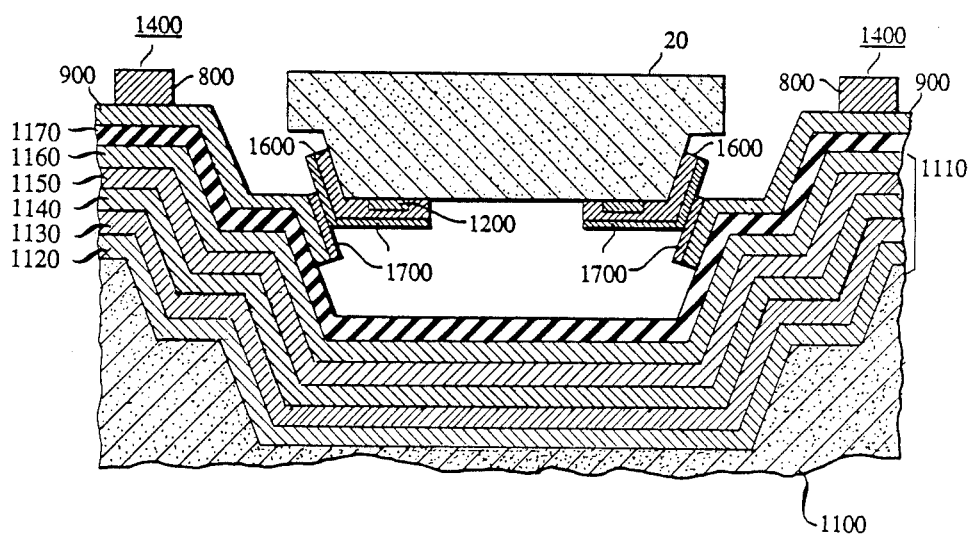
FIG. 4 is a cross-sectional view of a variant of the second embodiment.

In a variant of the second embodiment, having a configuration generally similar to that disclosed in U.S. Pat. No. 4,670,770, hereby incorporated by reference, and depicted in FIG. 4, each chip 20 includes beveled sides achieved by crystallographically etching the chip substrate. In addition, the carrier substrate 1100 includes wells with correspondingly beveled surfaces, achieved through similar crystallographic etching. The beveled sides of each chip include strips 1600 of electrically conductive and solder-wettable material, e.g., Au, which extend from the beveled sides to the IC-bearing surface of the chip, into electrical contact with the contact pads 1200 of the chip. In addition, the upper surface of, as well as the beveled surfaces of the wells in, the carrier substrate 1100 are covered by a ground plane 1100 which, in turn, is covered by a layer 1170 of electrically insulating material, e.g., a layer of $SiO_2$. The portions of the electrically insulating layer 1170 overlying the beveled surfaces of the wells are covered by strips 900 of (solder-wettable) Au. These strips extend to the portions of the layer 1170 overlying the upper surface of the carrier substrate 1100 to contact interconnects 1400. The beveled sides of the chips 20, and the correspondingly beveled surfaces of the wells in the carrier substrate 1100, not only permit the chips to be received into the wells, but permit the strips 1600 to be precisely aligned with, and make electrical contact to, the strips 900 (which thus make electrical contact to the contact pads 1400) through solder strips 1700.

Significantly, as before, the ground plane 1110 includes a layer 1150 of superconducting material sandwiched between layers 1140 and 1160 containing, and preferably consisting essentially of, Ag and/or Au. As before, the ground plane preferably also includes a layer 1130 of, for example, W, Mo or Ta, as well as a layer 1120 of slightly silicon-rich metal silicide. In addition, one or more of the interconnects 1400 includes a region 800 of superconducting material. Each such interconnect also includes a region 900 of Au between the superconducting region 800 and the electrically insulating layer 1170. Conveniently, as shown in FIG. 5, this region 900 of Au is just an extension of the strip 900 of Au overlying one of the beveled surfaces of one of the wells.

The procedures involved in fabricating the second embodiment are now conventional, with the superconducting interconnects and ground planes being fabricated using techniques described above.

EXAMPLE 1

A silicon substrate having length, width and thickness dimensions of 2 cm, 2 cm, and 105 cm, and whose upper surface had previously been cleaned with buffered HF and rinsed with deionized water, was placed within an electron-beam (e-beam) evaporation chamber. This chamber included three electron guns containing, respectively, Y, Ba and Cu.

The chamber was sealed and evacuated to a pressure of $10^{-7}$ torr. Appropriate amounts of power were then supplied to the three electron guns to produce rates of deposition of the Y, Ba and Cu (onto the silicon substrate), as measured by quartz crystal thickness monitors, in the stoichiometric ratios of 1:2:3. Simultaneously, pure oxygen was flowed into the chamber at a flow rate sufficient to produce a pressure of $3 \times 10^{-5}$ torr in the chamber. This deposition procedure was continued until a layer of material, having a thickness of about 1 $\mu$m, had formed on the silicon substrate. From previous experience, it was known that the deposited layer was amorphous and had the nominal composition $YBa_2Cu_3O_x$, where $x<7$.

The silicon substrate, covered with the layer of $YBa_2Cu_3O_x$, was placed within a furnace into which pure $O_2$ was continuously flowed. The temperature within the furnace was raised to 500 degrees C. and maintained at the level for 10 minutes. This heating procedure served to stabilize the layer of $YBa_2Cu_3O_x$, i.e., prevent interactions with moisture and other constituents in ambient air.

The silicon substrate was then annealed to convert the layer of amorphous $YBa_2Cu_3O_x$ to a crystalline state, known to be superconducting. This annealing procedure was carried out in an atmosphere of pure oxygen and at a temperature of 850 degrees C. for 30 minutes.

Using a conventional ohmmeter, having two leads, the room-temperature (23 degrees C.) resistance of the annealed layer was measured, and found to be greater than 5 kilohms. From previous experience, it was known that this is a clear indication that the layer is not superconducting.

EXAMPLE 2

Using conventional rf-sputtering techniques, a layer of W, having a thickness of 0.2 $\mu$m., was deposited onto the (previously cleaned) upper surface of a silicon substrate, having the dimensions described in Example 1. A layer of Ag, having a thickness of 0.1 $\mu$m, was deposited onto the layer of W, using similar techniques. A crystalline layer of $YBa_2Cu_3O_7$, having a thickness of 1.0 $\mu$m, was then formed on the layer of Ag, using the deposition and annealing techniques described in Example 1.

Using the conventional ohmmeter of Example 1, the room-temperature resistance of the crystalline layer of $YBa_2Cu_3O_7$ was measured, and found to be about 200 ohm. From previous experience, it was known that this is an indication that the $YBa_2Cu_3O_7$ is at least partially superconducting at a temperature equal to or less than about 95 K. This was confirmed by measuring the resistance of the $YBa_2Cu_3O_7$, as a function of temperature, from room temperature to 4.2 K., using the conventional four-probe technique.

What is claimed is:

1. A device, comprising:
   a substrate which includes silicon-containing material;
   first and second device components formed in and/or on or supported by, said substrate; and
   an interconnect, also supported by said substrate, which electrically contacts, and extends between, said device components, characterized in that
   said interconnect includes a first region of superconducting material and at least a second region including Ag and/or Au, said second region being interposed between said first region and said substrate.

2. The device of claim 1 wherein said interconnect further includes a barrier to diffusion of Ag and/or Au, interposed between said second region and said substrate.

3. The device of claim 2 wherein said interconnect still further includes a region of metal silicide interposed between said barrier and said substrate.

4. The device of claim 1 wherein said first device component includes a field effect transistor, which includes a source, a drain and a gate electrode.

5. The device of claim 1 wherein said first device component includes a first integrated circuit and said second device component includes a second integrated circuit.

6. The device of claim 1 wherein said superconducting material includes copper and oxygen.

7. The device of claim 2 wherein said barrier includes tungsten.

8. The device of claim 2 wherein said barrier includes molybdenum.

9. The device of claim 2 wherein said barrier includes tantalum.

* * * * *